United States Patent
Chang et al.

(10) Patent No.: US 10,964,918 B1
(45) Date of Patent: Mar. 30, 2021

(54) DISPLAY SCREEN AND TERMINAL

(71) Applicant: BEIJING XIAOMI MOBILE SOFTWARE CO., LTD., Beijing (CN)

(72) Inventors: Cheng Chang, Beijing (CN); Anyu Liu, Beijing (CN); Chengfang Sun, Beijing (CN); Xinyi Wang, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 16/747,469

(22) Filed: Jan. 20, 2020

(30) Foreign Application Priority Data

Sep. 19, 2019 (CN) .......................... 201910889336.0

(51) Int. Cl.
*H01L 51/52* (2006.01)
*H01L 51/00* (2006.01)

(52) U.S. Cl.
CPC ...... *H01L 51/5281* (2013.01); *H01L 51/0097* (2013.01); *H01L 51/5253* (2013.01); *H01L 51/5268* (2013.01); *H01L 2251/5338* (2013.01)

(58) Field of Classification Search
CPC ............. H01L 51/5253; H01L 51/0097; H01L 51/5271; H01L 27/3272; H01L 29/78633; G09F 9/30
See application file for complete search history.

(56) References Cited

U.S. PATENT DOCUMENTS

| | | | | |
|---|---|---|---|---|
| 2010/0118522 | A1* | 5/2010 | Hente | F21K 99/00 362/190 |
| 2015/0138699 | A1* | 5/2015 | Yamazaki | H02J 7/025 361/679.03 |
| 2016/0054489 | A1* | 2/2016 | Koshitouge | G02B 5/1857 257/98 |
| 2016/0271914 | A1 | 9/2016 | Xie | |
| 2019/0325812 | A1* | 10/2019 | Mao | H01L 25/0753 |
| 2019/0341580 | A1* | 11/2019 | Gu | H01L 51/56 |

FOREIGN PATENT DOCUMENTS

| | | |
|---|---|---|
| CN | 106292045 A | 1/2017 |
| CN | 109841644 A | 6/2019 |
| KR | 20150069846 A | 6/2015 |

OTHER PUBLICATIONS

Extended European search report of counterpart EP application No. 20155527.3 dated Aug. 3, 2020.

* cited by examiner

*Primary Examiner* — Caridad Everhart
(74) *Attorney, Agent, or Firm* — Syncoda LLC; Feng Ma (57) ABSTRACT

A display screen includes: a flexible display panel, and a flexible protective layer covering a light-emitting surface of the flexible display panel, wherein a side surface of the flexible protective layer facing away from the flexible display panel is a light-emitting side surface, and an anti-reflection structure is disposed on the light-emitting side surface. An unevenness feel on a surface of the display screen can be reduced, thereby improving performance of a foldable product such as a foldable terminal.

18 Claims, 7 Drawing Sheets

DISPLAY SCREEN AND TERMINAL

CROSS-REFERENCE TO RELATED APPLICATION

This application claims priority to Chinese Patent Application No. 201910889336.0, filed on Sep. 19, 2019, the disclosure of which is hereby incorporated by reference in its entirety.

BACKGROUND

At present, there is a development tendency for display screens to be flexible. Owing to a bendable characteristic, the flexible display screens are widely applied to foldable screen products. As a display screen of the foldable screen product needs to be folded when in use, a protective material is generally disposed on the surface of the display screen to protect the display screen.

SUMMARY

Embodiments of the present disclosure relate to a display screen and a terminal.

Various embodiments of the present disclosure provide a display screen, including: a flexible display panel, and a flexible protective layer covering a light-emitting surface of the flexible display panel, wherein a side surface of the flexible protective layer facing away from the flexible display panel is a light-emitting side surface; and an anti-reflection structure is disposed on the light-emitting side surface.

In an implementation of the embodiment of the present disclosure, the anti-reflection structure includes a plurality of grooves spaced apart on the light-emitting side surface; or the anti-reflection structure includes a plurality of protrusions spaced apart on the light-emitting side; or the anti-reflection structure includes a plurality of protrusions and a plurality of grooves alternately spaced apart on the light-emitting side.

In some embodiments of the present disclosure, a cross section of the groove in a direction parallel to the display screen is a closed curved pattern or a polygon, and the groove is cylindrical; or an area of the cross section of the groove in the direction parallel to the display screen is positively correlated with a distance from the cross section to the light-emitting surface.

In some embodiments of the present disclosure, a cross section of the protrusion in a direction parallel to the display screen is a closed curved pattern or a polygon, and the protrusion is cylindrical; or an area of the cross section of the protrusion in the direction parallel to the display screen is negatively correlated with a distance from the cross section to the light-emitting surface.

In some embodiments of the present disclosure, the anti-reflection structure and the flexible protective layer are formed into an integral structure.

In some embodiments of the present disclosure, the display screen further includes a transparent layer covering the anti-reflection structure.

In some embodiments of the present disclosure, the display screen further includes a scattering layer covering the light-emitting side surface, wherein the anti-reflection structure and the scattering layer are formed into an integral structure.

In some embodiments of the present disclosure, the display screen further includes a diffusion layer covering the light-emitting surface, wherein the diffusion layer is disposed between the flexible display panel and the flexible protective layers.

In some embodiments of the present disclosure, the diffusion layer is an optical adhesive layer in which haze particles are provided; or, the diffusion layer is a resin material layer in which a light diffusing agent is mixed.

In some embodiments of the present disclosure, the flexible protective layer at least includes a first protective film layer and a second protective film layer stacked together, and the second protective film layer is located between the first protective film layer and the flexible display panel.

In some embodiments of the present disclosure, the first protective film layer is a polyimide thin film, and the second protective film layer is a polyimide thin film or an ultra-thin float glass film layer.

In some embodiments of the present disclosure, the display screen further includes a substrate located on a back surface of the flexible display panel, wherein the light-emitting surface and the back surface are two opposite side surfaces of the flexible display panel.

In some embodiments of the present disclosure, the substrate includes a foldable region and a non-foldable region connected to the foldable region, the foldable region is made of a flexible material, and the non-foldable region is made of a rigid material; or, the substrate is a flexible substrate.

In some embodiments of the present disclosure, the rigid material is a steel sheet.

In some embodiments of the present disclosure the display screen further includes at least one of a polarizer, a touch panel, a back plate film and a buffer layer, wherein the polarizer is located on the light-emitting surface and the touch panel is located on the light-emitting surface, the back plate film is located on the back surface of the flexible display panel and the buffer layer is located on the back surface of the flexible display panel, and the light-emitting surface and the back surface are two opposite side surfaces of the flexible display panel.

Various embodiments of the present disclosure also provide a terminal, including the display screen as described above.

It is to be understood that the above general description and the following detailed description are merely exemplary and explanatory, and are not intended to limit the present disclosure.

BRIEF DESCRIPTION OF THE DRAWINGS

In order to describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skilled in the art may also derive other drawings from these accompanying drawings without creative efforts.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of apparatuses and methods consistent with aspects related to the disclosure as recited in the appended claims.

With the development and advancement of technologies, the proportion of flexible display screens in the future will gradually increase. Thus, foldable screen products using the flexible display screens will increasingly appear in the electronic product market. The foldable screen product realizes a purpose of bending a display screen thereof through the technology of the flexible display screen. As the display screen of the foldable screen product needs to be folded when in use, a protective material is disposed on the surface of the display screen to protect the display screen.

The flexible protective layer is typically made of a relatively flexible material generally disposed on the surface of the display screen. During the use of the foldable screen product, the flexible protective layer on the display screen of the folding screen product can be prone to forming bending marks due to repeated bending. As a result, the surface of the display screen can become uneven, which is visible to naked eyes. Thus, performance of the foldable product is adversely affected by poor flatness.

Figure 1:
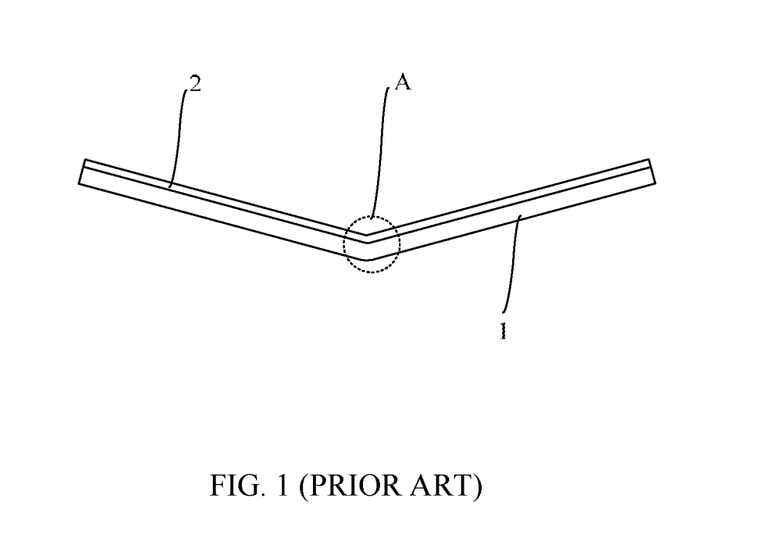
FIG. 1 is a schematic structure diagram of a display screen provided in the related art.

FIG. 1 is a schematic structure diagram of a display screen provided in the related art. As shown in FIG. 1, the display screen is a foldable screen. A protective film 2 is disposed on a surface of the display panel 1 to protect a screen body, and may be a polyimide thin film (PI film) or ultra-thin glass.

However, due to a soft material of the PI film, during the use of the folding screen product, a surface dent, poor flatness, an uneven appearance and the like appear on the PI film at a foldable portion (see A in FIG. 1) on the display screen of the foldable screen product, adversely affecting the using performance of the foldable screen product. Meanwhile, the ultra-thin glass is fragile, and thus, the ultra-thin glass is prone to be exploded after repeated bending during the use of the foldable screen product, resulting in injury to a user.

Figure 2:
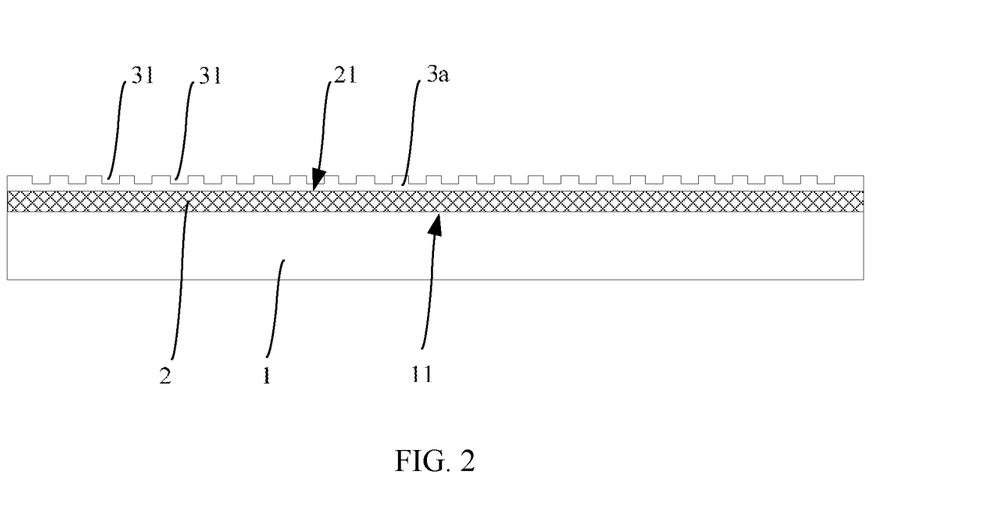
FIG. 2 is a schematic structure diagram of a cross section of a display screen according to some embodiments.

FIG. 2 is a schematic structure diagram of a cross section of a display screen according to some embodiments. As illustrated in FIG. 2, the display screen includes a flexible display panel 1 and a flexible protective layer 2. The flexible protective layer 2 covers a light-emitting surface 11 of the flexible display panel 1; a side surface of the flexible display film 2 facing away from the flexible display panel 1 is a light-emitting side surface 21; and an anti-reflection structure is disposed on the light-emitting side surface 21. Here, the anti-reflection structure is configured to reduce the possibility of specular reflection of external environment light on the light-emitting side surface 21.

In the embodiment of the present disclosure, the light-emitting surface of the flexible display panel is covered with the flexible protective layer for protecting the flexible display panel, and the anti-reflection structure is disposed on the light-emitting side surface of the flexible protective layer. With the anti-reflection structure, the possibility of specular reflection of external environment light on the light-emitting side surface of the flexible protective layer is reduced, so that even if a crease and an uneven portion visible to a naked eye caused by repeated bending appear on a protective film of the display screen, intensity of light reflected from the crease and the uneven portion on the flexible protective layer to a human eye can be weakened under the action of the anti-reflection structure. Thus, the crease and the uneven portion are less visible to the human eye. Therefore, the unevenness feeling of the display screen caused by the specular reflection is reduced, enabling the appearance of the display screen to be more flat, and improving the using performance of the folding screen product.

The flexible display panel refers to a display panel that can deform. For example, the flexible display panel may deform by bending, folding or the like. The flexible protective layer refers to a protective layer that can deform. For example, the flexible protective layer may deform by bending, folding or the like. The light-emitting surface of the flexible display panel refers to a side surface of the display screen on the flexible display panel.

In some embodiments of the present disclosure, the display screen using the flexible display panel can realize a folding function of the foldable product. The flexible display panel may be an organic light-emitting diode (OLED). For example, the flexible display panel may be an AMOLED (Active-matrix OLED) in the OLED or a PMOLED (Passive matrix OLED) in the OLED.

Figure 6:
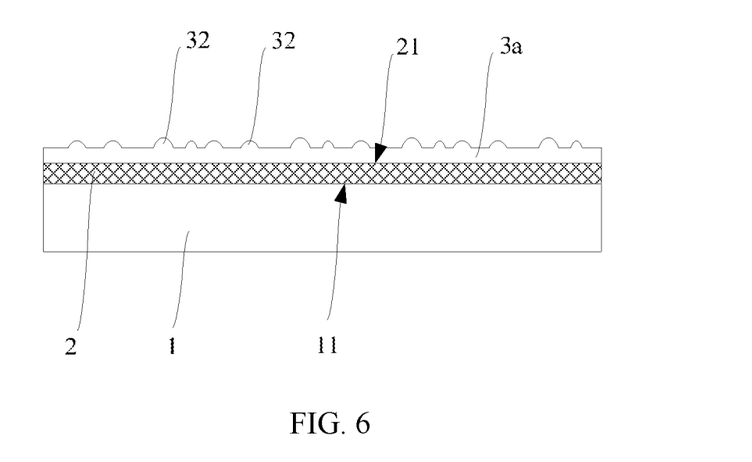
FIG. 6 is a schematic structure diagram of a cross section of another display screen according to some embodiments.
Figure 7:
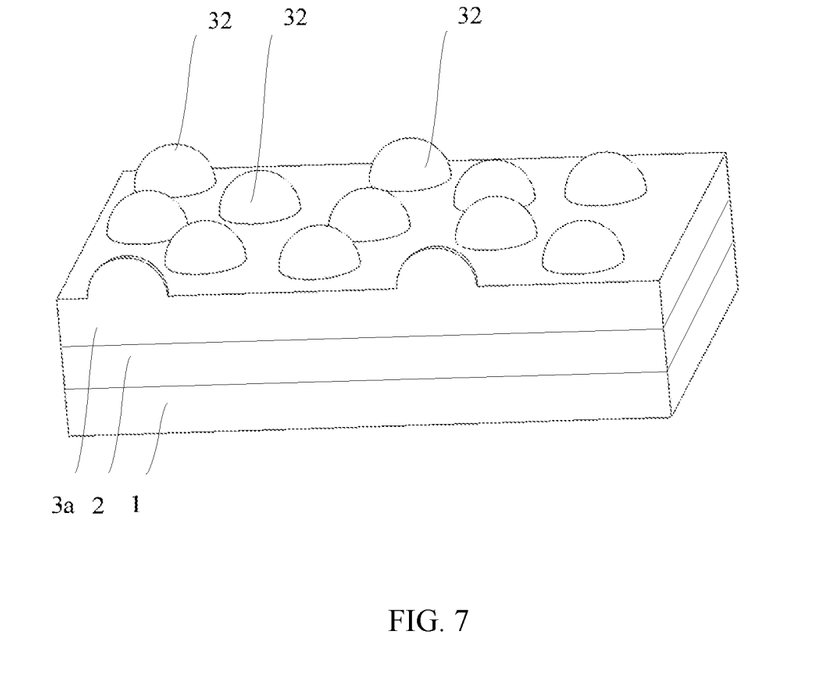
FIG. 7 is a schematically partial perspective structure diagram of the display screen illustrated in FIG. 6.

In some embodiments of the present disclosure, in the embodiment of the present disclosure, the anti-reflection structure may be directly disposed on the flexible protective layer, That is, the flexible protective layer and the anti-reflection structure are formed into an integral structure, as illustrated in the embodiment in FIG. 7. Or, the anti-reflection structure may also be indirectly disposed on the flexible protective layer, namely, disposed on the film layer on the flexible protective layer, such as the embodiments illustrated in FIGS. 2, 3, 4, 5, and 6.

Exemplarily, referring to FIG. 2, in addition to the flexible display panel 1 and the flexible protective layer 2, the display screen further includes a scattering layer 3a on which the anti-reflection structure is located. That is, the scattering layer 3a covers the light-emitting side surface 21, and the anti-reflection structure and the scattering layer 3a are formed into an integral structure. By providing the scattering layer 3a as a carrier of the anti-reflection structure, directly processing the anti-reflection structure on the flexible protective layer 2 can be avoided, thereby simplifying a processing process of the flexible protective layer, and improving the processing efficiency. Moreover, compared with the anti-reflection structure directly formed on the flexible protective layer 2, the anti-reflection structure formed on the scattering layer 3b has less influence on the flatness of the display screen, so that a process of forming a transparent and flat film layer on the anti-reflection structure can be eliminated, further improving the processing efficiency.

Exemplarily, the scattering layer may be an optical film formed on the light-emitting side surface of the flexible protective layer, and the anti-reflection structure on the optical film can be formed by the following process. A workbench is coated with a layer of resin material; after the resin material layer is cured, a desired anti-reflection structure is formed on the resin material layer through a photo-lithographic process or a chemical etching process, namely, forming the anti-reflection structure on the optical film; after the optical film is bonded to the flexible protective layer, a purpose of indirectly forming the anti-reflection structure on the flexible protective layer 2 is achieved.

Exemplarily, the anti-reflection structure may be implemented at least through the following three manners.

In the first manner, the anti-reflection structure includes a plurality of grooves spaced apart on the light-emitting side surface. FIG. 2 is a schematic structure diagram of a display screen according to some embodiments. As illustrated in FIG. 2, the anti-reflection structure includes a plurality of grooves 31 on the light-emitting side surface 21, and the plurality of grooves 31 are spaced apart. The light-emitting side surface 21 of the flexible protective layer 2 is caused to be uneven by providing the plurality of grooves 31 on the light-emitting side surface 21, and diffuse reflection occurs when the external environment light is incident on the light-emitting side surface 21 of the flexible protective layer 2. As a result, the external environment light deviates from the original direction thereof and scatters in different directions. Therefore, with the anti-reflection structure, the possibility of specular reflection of the external environment light on the light-emitting side surface 21 is reduced, and intensity of light reflected from a crease and an uneven portion on the flexible protective layer to a human eye is weakened. Thus, the crease and the uneven portion are less visible to the human eye, so that the unevenness feeling of the display screen caused by the specular reflection is effectively reduced, enabling the appearance of the display screen to be more flat, and improving the using performance of the folding screen product.

In some embodiments of the present disclosure, the cross section of the groove in the direction parallel to the display screen may be a closed curved pattern or a polygon. The closed curved pattern refers to a closed pattern formed by a curve in a surrounding manner, for example, a circle, an ellipse or the like. The polygon is a pattern including three or more line segments which are sequentially connected end to end, such as a regular polygon or a non-normal polygon.

In some embodiments of the present disclosure, the groove is a cylindrical groove (for example, the groove illustrated in FIG. 2); or the area of the cross section of the groove in a direction parallel to the display screen is positively correlated with a distance from the cross section to the light-emitting surface 11. The cylindrical groove refers to a groove whose cross-section area in a direction parallel to the display screen always remains constant. The positive correlation of the area of the cross section of the groove with the distance from the cross section to the light-emitting surface 11 means that the area of the cross section of the groove increases with the distance from the cross section to the light-emitting surface 11.

Exemplarily, as illustrated in FIG. 2, each of the plurality of grooves 31 on the light-emitting side surface 21 is a cylindrical groove, and the area of the cross section of the cylindrical groove a the direction parallel to the display screen always remains constant, so that the cylindrical groove has a rectangular cross section in a direction perpendicular to the display screen.

Figure 3:
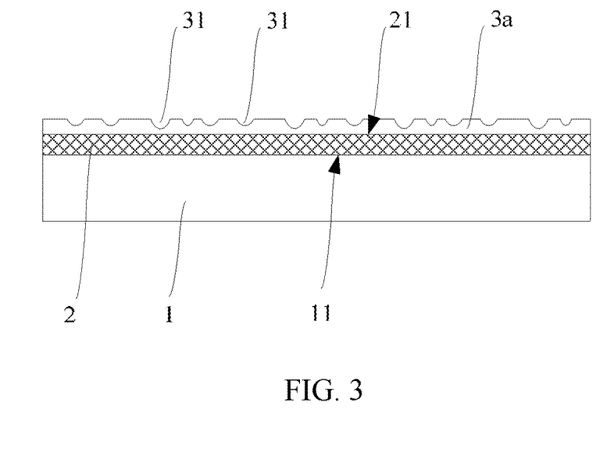
FIG. 3 is a schematic structure diagram of a cross section of another display screen according to some embodiments.
Figure 4:
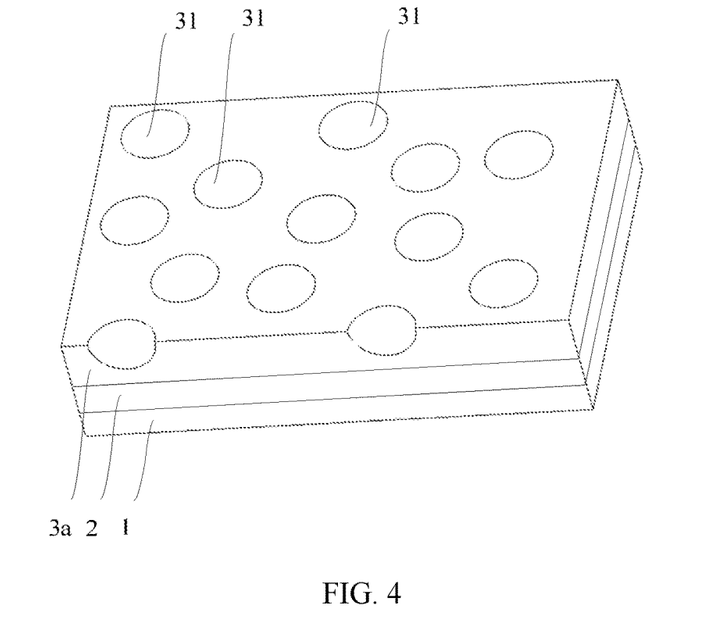
FIG. 4 is a schematically partial perspective structure diagram of the display screen illustrated in FIG. 3.

Exemplarily, FIG. 3 is a schematic structure diagram of a cross section of another display screen according to some embodiments. FIG. 4 is a schematically partial perspective structure diagram of the display screen illustrated in FIG. 3, As illustrated in FIGS. 3 and 4, the cross section of each of the plurality of grooves 31 on the light-emitting side surface 21 in the direction parallel to the display screen is circular, and the plurality of grooves 31 are spaced apart. The groove 31 is a hemispherical groove, and the area of the cross section of the hemispherical groove gradually increases from the bottom of the hemispherical groove to the opening of the hemispherical groove, That is, the area of the cross section of the hemispherical groove parallel to the display screen is positively correlated with the distance from the cross section to the light-emitting surface 11.

It should be noted that, in addition to the hemispherical groove illustrated in FIGS. 3 and 4, the groove, area of the cross section of which in the direction parallel to the display screen is negatively correlated with the distance from the cross section to the light-emitting surface may also be a groove, cross section of which in the direction perpendicular to the display screen is triangular, trapezoidal or irregular-shaped, That is, the groove may be a tapered groove, a table-shaped groove or the like, which is not limited in the present embodiment.

In the above two examples, the area of the cross section of the groove 31 is much smaller than the area of the flexible protective layer 2. Thus, the grooves 31 can be spaced apart at various locations on the light-emitting side surface 21. For example, the plurality of grooves 31 may be unevenly spaced apart on the light-emitting side surface 21 (as illustrated in FIGS. 3 and 4); and the plurality of grooves 31 may also be spaced apart on the light-emitting side surface 21 in an array (as illustrated in FIG. 2), Compared with the evenly spaced arrangement of the plurality of grooves 31, the unevenly spaced arrangement of the grooves 31 causes the formed scattering layer 3a to be more likely to diffusely reflect light incident on the surface of the scattering layer 3a, so that the possibility of specular reflection of the external environment light on the light-emitting side surface 21 is reduced. Thus, the unevenness feeling of the display screen caused by the specular reflection is reduced; thereby enabling the appearance of the display screen to be more flat.

Figure 5:
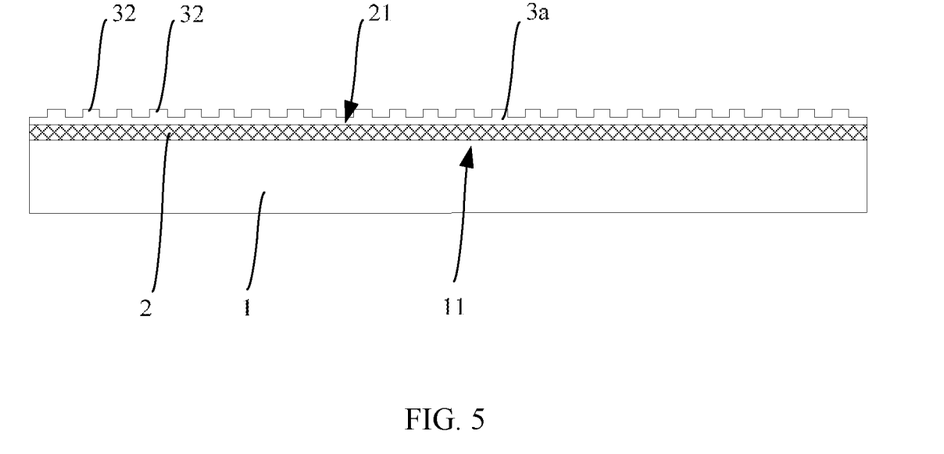
FIG. 5 is a schematic structure diagram of a cross section of another display screen according to some embodiments.

In the second manner, the anti-reflection structure comprises a plurality of protrusions spaced apart on the light-emitting side surface. FIG. 5 is a schematic structure diagram of a cross section of another display screen according to some embodiments. As illustrated in FIG. 5, the anti-reflection structure comprises a plurality of protrusions 32 on the light-emitting side surface 21, and the plurality of protrusions 32 are spaced apart. The light-emitting side surface 21 of the flexible protective layer 2 is caused to be uneven by the plurality of protrusions 32 on the light-emitting side surface 21, and diffuse reflection occurs when the external environment light is incident on the light-emitting side surface 21 of the flexible protective layer 2. As a result, the external environment light deviates from the original direction thereof and scatters in different directions.

Therefore, with the anti-reflection structure, the possibility of specular reflection of the external environment light on the light-emitting side surface 21 is reduced, and intensity of light reflected from a crease and an uneven portion on the flexible protective layer 2 to a human eye is weakened. Thus, the crease and the uneven portion are less visible to the human eye, so that the unevenness feeling of the display screen caused by the specular reflection is effectively reduced, enabling the appearance of the display screen to be flatter, and improving the using performance of the folding screen product.

In some embodiments of the present disclosure, the cross section of the protrusion in a direction parallel to the display screen may be a closed curved pattern or a polygon, and the protrusion is a cylindrical protrusion (for example, a protrusion illustrated in FIG. 5). Or, an area of the cross section of the protrusion in the direction parallel to the display screen is negatively correlated with a distance from the cross section to the light-emitting surface. The cylindrical protrusion refers to a protrusion whose cross-section area in the direction parallel to the display screen always remains constant. The negative correlation of the area of the cross section of the protrusion with the distance from the cross section to the light-emitting surface 11 means that the area of the cross section of the protrusion decreases as the distance from the cross section to the light-emitting surface 11 increases.

Exemplarily, as illustrated in FIG. 5, each of the plurality of protrusions 32 on the light-emitting side surface 21 is a cylindrical protrusion, and the area of the cross section of the cylindrical protrusion in the direction parallel to the display screen always remains constant, so that the cylindrical protrusion has a rectangular cross section in a direction perpendicular to the display screen.

Exemplarily, FIG. 6 is a schematic structure diagram of a cross section of another display screen according to some embodiments. FIG. 7 is a schematically partial perspective structure diagram of the display screen illustrated in FIG. 6. As illustrated in FIGS. 6 and 7, the cross section of each of the plurality of protrusions 32 on the light-emitting side surface 21 in the direction parallel to the display screen is circular, and the plurality of protrusions 32 are spaced apart. The protrusion 32 is a hemispherical protrusion, and the area of the cross section of the hemispherical groove gradually, decreases from one end of the hemispherical protrusion near to the light-emitting surface 11 to the other end of the hemispherical protrusion. That is, the area of the cross section of the hemispherical groove parallel to the display screen is negatively correlated with the distance from the cross section to the light-emitting surface 11.

It should be noted that in addition to the hemispherical protrusion illustrated in FIGS. 6 and 7, the protrusion whose area of the cross section in the direction parallel to the display screen is negatively correlated with the distance from the cross section to the light-emitting surface may also be a protrusion whose cross section in the direction perpendicular to the display screen is triangular, trapezoidal or irregular-shaped. That is, the protrusion may be a tapered protrusion, a table-shaped protrusion or the like, which is not limited in the present embodiment.

In the above two implementations, the area of the cross section of the protrusion 32 is much smaller than the area of the flexible protective layer 2. Thus, the protrusions 32 can be spaced apart at various locations on the light-emitting side surface 21 of the flexible protective layer 2. For example, the plurality of protrusions 32 may be unevenly spaced apart on the light-emitting side surface 21 (as illustrated in FIG. 5), or may be evenly spaced apart on the light-emitting side surface 21 in an array (as illustrated in FIGS. 6 and 7). Compared with the evenly spaced array arrangement of the plurality of protrusions 32, the unevenly spaced arrangement of the protrusions 31 causes the light incident on the surface of the scattering layer 3a to be diffusely reflected more probably, so that the possibility of specular reflection of the external environment light on the light-emitting side surface 21 is reduced. Thus, the unevenness feeling of the display screen caused by the specular reflection is reduced, thereby enabling the appearance of the display screen to be more flat.

Figure 8:
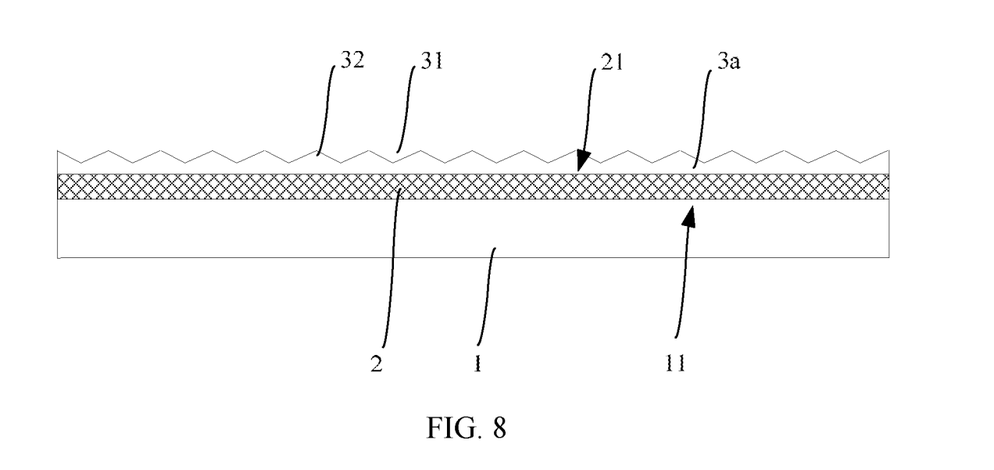
FIG. 8 is a schematic structure diagram of a cross section of yet another display screen according to some embodiments.

In the third manner, the anti-reflection structure comprises a plurality of protrusions and a plurality of grooves alternately spaced apart on the light-emitting side surface. Exemplarily, FIG. 8 is a schematic structure diagram of a cross section of yet another display screen according to some embodiments. As illustrated in FIG. 8, the anti-reflection structure comprises a plurality of protrusions 32 and a plurality of grooves 31 on the light-emitting side surface 21, and the plurality of protrusions 32 and the plurality of grooves 31 are alternately spaced apart. The light-emitting side surface 21 of the flexible protective layer 2 is caused to be uneven by the plurality of protrusions 32 and the plurality of grooves 31 on the light-emitting side surface 21 of the flexible protective layer 2, and diffuse reflection occurs when the external environment light is incident on the light-emitting side surface 21 of the flexible protective layer 2. As a result, the external environment light deviates from the original direction thereof and scatters in different directions. Therefore, with the anti-reflection structure, the possibility of specular reflection of the external environment light on the light-emitting side surface 21 is reduced, and intensity of light reflected from a crease and an uneven portion on the flexible protective layer 2 to a human eye is weakened. Thus, the crease and the uneven portion are less visible to the human eye, so that the unevenness feeling of the display screen caused by the specular reflection is effectively reduced, enabling the appearance of the display screen to be more flat, and improving the using performance of the folding screen product.

Exemplarily, as illustrated in FIG. 8, the plurality of protrusions 32 and the plurality of grooves 31 are alternately spaced apart on the surface of the anti-reflection film. Compared with the flexible protective layer 2 whose light-emitting side surface 21 is only provided with the grooves 31 or the protrusions 32, in the flexible protective layer 2 whose light-emitting side surface 21 is provided with the plurality of protrusions 32 and the plurality of grooves 31, the light-emitting side surface 21 of the flexible protective layer 2 is caused to be more uneven, and diffuse reflection occurs when the external environment light is incident on the light-emitting side surface 21 of the flexible protective layer 2. As a result, the external environment light deviates from the original direction thereof and scatters in different directions. Therefore, with the anti-reflection structure, the possibility of specular reflection of the external environment light on the light-emitting side surface 21 is reduced, and intensity of light reflected from a crease and an uneven portion on the flexible protective layer 2 to a human eye is weakened. Thus, the crease and the uneven portion are less visible to the human eye, so that the unevenness feeling of the display screen caused by the specular reflection is effectively reduced, enabling the appearance of the display screen to be more flat, and improving the using performance of the folding screen product.

Exemplarily, the cross section of each of the plurality of protrusions 32 and grooves 31 on the light-emitting side surface 21 in the direction parallel to the display screen may be a closed curved pattern or a polygon, and for example, may be a circle, a rectangle, or the like. The protrusion 32 may be a hemispherical protrusion, and the area of the cross section of the hemispherical protrusion in the direction parallel to the display screen is negatively correlated with the distance from the cross section to the light-emitting surface 11. The groove 31 may be a hemispherical groove, and the area of the cross section of the hemispherical groove in the direction parallel to the display screen is positively correlated with the distance from the cross section to the light-emitting surface 11. The areas of the cross sections of the protrusion 32 and the groove 31 are much smaller than the area of the flexible protective layer 2. Thus, the protrusions 32 and the groove 31 can be spaced apart at various locations on the light-emitting side surface 21 of the flexible protective layer 2. For example, the plurality of protrusions 32 and the groove 31 may be unevenly alternately spaced apart on the light-emitting side surface 21, or may be evenly spaced apart on the light-emitting side surface 21 in an array. Compared with the evenly spaced array arrangement (as illustrated in FIG. 8), the unevenly spaced arrangement causes the light incident on the surface of the scattering layer 3a to be diffusely reflected more probably, so that the possibility of specular reflection of the external environment light on the light-emitting side surface 21 is reduced. Thus, the unevenness feeling of the display screen caused by the specular reflection is reduced, thereby enabling the appearance of the display screen to be more flat.

It should be noted that in addition to the hemispherical protrusion, the protrusion whose area of the cross section in the direction parallel to the display screen is negatively correlated with the distance from the cross section to the light-emitting surface may also be a tapered protrusion, a table-shaped protrusion, or the like. In addition to the hemispherical groove, the groove whose area of the cross section in the direction parallel to the display screen is positively correlated with the distance from the cross section to the light-emitting surface may also be a tapered groove, a table-shaped groove, or the like. Besides, the protrusion may be a cylindrical protrusion, and the groove may be a cylindrical groove, which are not limited in the present embodiment.

Figure 9:
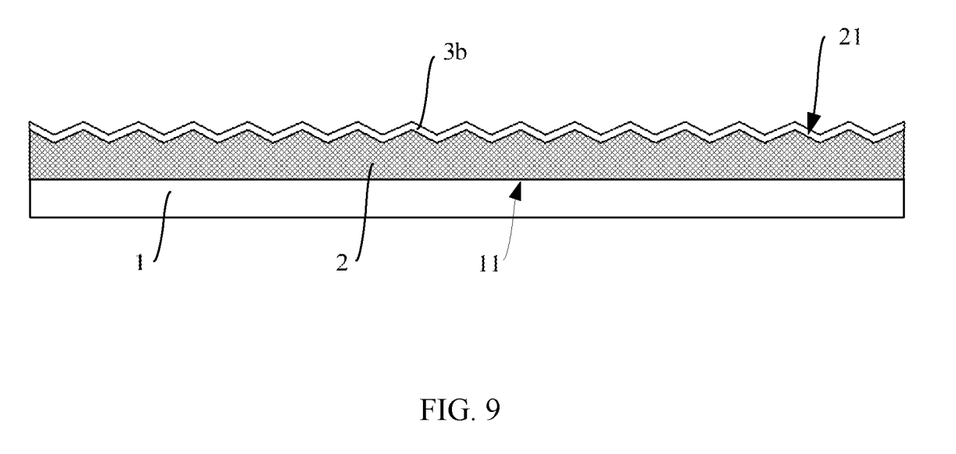
FIG. 9 is a schematic structure diagram of a cross section of yet another display screen according to some embodiments.

FIG. 9 is a schematic structure diagram of a cross section of yet another display screen according to some embodiments. As illustrated in FIG. 9, the anti-reflection structure is directly arranged on the flexible protective layer 2, and is formed by directly processing on the flexible protective layer 2. That is, the anti-reflection structure and the flexible protective layer 2 are of an integral structure. In this way, using an additional other film as a carrier for the anti-reflection structure is avoided, so that the manufacturing cost is reduced.

Exemplarily, when the anti-reflection structure is processed on the flexible protective layer 2, the body of the formed flexible protective layer may be coated with a layer of resin material which may be the same as or different from the material of the body of the flexible protective layer. For example, the body of the flexible protective layer is coated with a layer of polyimide resin. After the resin material layer is coated on the body of the flexible protective layer and is cured, a desired anti-reflection structure can be formed on the resin material layer through the photolithography process or the chemical etching process. That is, the anti-reflection structure is located on the body of the flexible protective layer, and the anti-reflection structure and the body of the flexible protective layer together form the flexible protective layer. Thus, a purpose of directly forming the anti-reflection structure on the flexible protective layer 2 is achieved.

In some embodiments of the present disclosure, in the embodiment of the present disclosure, as illustrated in FIG. 9, the display screen may further comprise a transparent layer 3b covering the anti-reflection structure.

After the anti-reflection structure is directly formed on the flexible protective layer 2, the transparent layer 3b is formed on the anti-reflection structure. As the transparent layer 3b is thinner, the transparent layer 3b will rise and fall with the unevenness on the anti-reflection structure to be uneven. The transparent layer 3b covers the anti-reflection structure, so that on one hand, a purpose of protecting the anti-reflection structure is achieved; and on the other hand, the transparent layer 3b can play the role of changing a light reflection direction, namely, the role of reducing the possibility of specular reflection of the external environment light on the light-emitting side surface.

Exemplarily, the transparent layer may be an optical film covering the anti-reflection structure. The optical film can be formed on the anti-reflection structure through the following process. A resin material layer is coated, wherein it is ensured that the thickness of the resin material layer does not exceed the thickness of the groove or protrusion on the anti-reflection structure in a direction perpendicular to the display screen to prevent the resin material layer from completely filling the groove or covering the protrusion; after coating is completed, the resin material layer is cured to form the transparent layer.

Direct processing on the flexible protective layer 2 to form the anti-reflection structure can refer to at least three manners as described above, and will not be elaborated in present embodiment.

In some embodiments of the present disclosure, in the embodiment of the present disclosure, the flexible protective layer 2 may be of a single-layer structure, or may be of a multi-layer structure.

Figure 10:
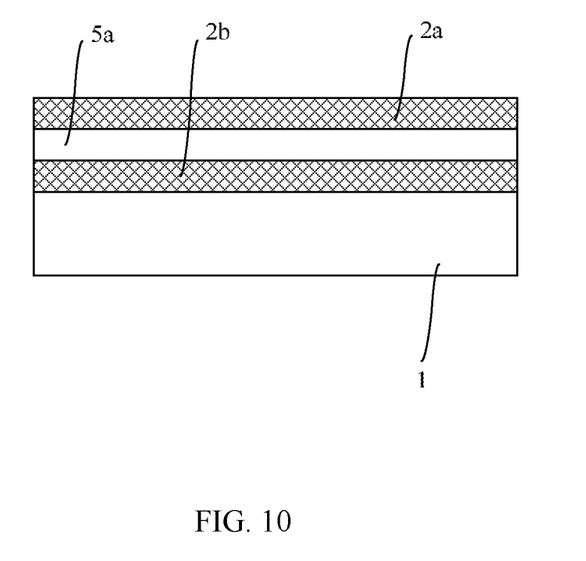
FIG. 10 is a schematic structure diagram of a cross section of a display screen according to some embodiments.

Exemplarily, FIG. 10 is a schematic structure diagram of a cross section of a display screen according to yet another exemplary embodiment. As illustrated in FIG. 10, the flexible protective layer 2 at least comprises a first protective film layer 2a and a second protective film layer 2b stacked together; and the second protective film layer 2b is located between the first protective film layer 2a and the flexible display panel 1. The flexible protective layer 2 formed by the at least two protective film layers can improve the overall flatness of the flexible display panel 1 and can increase the thickness of the flexible display panel 1. With the improved flatness and the increased thickness, the display screen is less prone to a crease and a dent caused by bending during the use of the foldable screen product, so that the unevenness feeling of the display screen caused by the specular reflection is reduced, thereby enabling the appearance of the display screen to be more flat, and improving the using performance of the folding screen product.

As illustrated in FIG. 10, the flexible protective layer 2 comprises a first protective film layer 2a and a second protective film layer 2b stacked together; and the second protective film layer 2b is located between the first protective film layer 2a and the flexible display panel 1.

Exemplarily, as illustrated in FIG. 10, both the first protective film layer 2a and the second protective film layer 2b are polyimide thin films. The two polyimide thin film layers can be bonded through a bonding layer 5a which may be formed by an optically clear adhesive. With a design that the flexible protective layer is formed by the two layers, the flexible protective layer has higher hardness, improved overall flatness, and increased thickness. Owing to the improved flatness and the increased thickness, the display screen is less prone to a crease and a dent caused by bending during the use of the foldable screen product, so that the unevenness feeling of the display screen caused by the specular reflection is reduced, thereby enabling the appearance of the display screen to be more flat, and improving the using performance of the folding screen product.

Exemplarily, as illustrated in FIG. 10, the first protective film layer 2a is a polyimide thin film, and the second protective film layer 2.b is an ultra-thin float glass film layer. The first protective film layer 2a and the second protective film layer 2b may be bonded through a bonding layer 5a. The ultra-thin float glass film layer has higher hardness than the polyimide thin film. With a design that the flexible protective layer is formed by the two protective film layers, the flexible protective layer has higher hardness, improved overall flatness, and increased thickness. Meanwhile, in the flexible protective layer, the ultra-thin float glass film layer is arranged between the first protective film layer 2a and the flexible display panel 1, so that the user is protected from injury caused by explosion of the ultra-thin glass, thereby improving the safety.

In the embodiment of the present disclosure, the ultra-thin float glass film layer refers to a float glass film layer having the thickness of 0.1 mm to 1.1 mm. The ultra-thin float glass can be divided into alkali-containing ultra-thin glass and alkali-free ultra-thin glass. The alkali-containing ultra-thin glass refers to an ultra-thin glass containing an alkali metal oxide in its chemical composition, namely, a soda-lime-silica glass or an aluminosilicate glass. The alkali-free ultra-thin glass generally refers to a hard borate glass, and contains $B_2O_3$ in its components, and has the characteristics of high light transmittance, good photoelectric performance, and the like.

In some embodiments of the present disclosure, the display screen further comprises a diffusion layer covering the light-emitting surface. The diffusion layer is located between the flexible display panel and the flexible protective layer. Here, the diffusion layer may scatter light emitted from the flexible display panel to the diffusion layer. As the diffusion layer is located between the flexible protective layer and the flexible display panel, light incident from the flexible display panel to the diffusion layer deviates from the original direction thereof and scatters in different directions. Thus, with the scattering effect of the diffusion layer, the light emitted from the flexible display panel to the flexible protective layer is softer, so that when light emitted from the flexible display panel enters a human eye after passing through the dent on the flexible protective layer, the unevenness is less visible to the human eye. Therefore, the appearance of the display screen is more flat, and the using performance of the folding screen product is improved.

Figure 11:
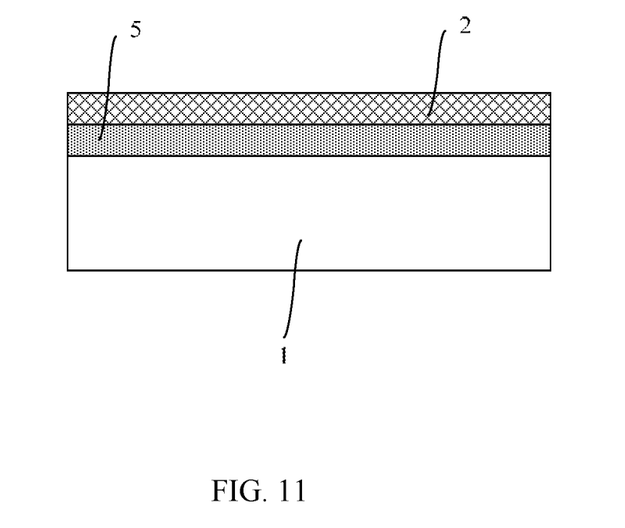
FIG. 11 is a schematic structure diagram of a cross section of a display screen according to some embodiments.

Exemplarily, as illustrated in FIG. 11, the diffusion layer is an optical adhesive layer 5 stacked between the flexible display panel 1 and the flexible protective layer 2. Haze particles are arranged in the optical adhesive layer 5. The optical adhesive layer 5 may be an optically clear adhesive (OCA). The optically clear adhesive may be mixed with the haze particles which may be selected from haze particles having a particle size ranging from 1 μm to 10 μm. The haze particles can diffuse the light emitted from the flexible display panel 1, so that the light incident on the diffusion layer deviates from its original direction and scatters in different directions. Thus, through the scattering effect of the haze particles mixed in the optically clear adhesive, when the light emitted from the flexible display panel 1 enters the human eye after passing through the dent on the flexible protective layer 2, an hazing visual effect is presented, so that the unevenness is less visible to the human eye, thereby enabling the appearance of the display screen to be more flat, and improving the using performance of the folding screen product.

It should be noted that the bonding layer 5a in FIG. 10 is formed by the optically clear adhesive. If the haze particles are mixed in the bonding layer 5a, the optical adhesive layer 5 illustrated in FIG. 11 can be formed. In addition, in the embodiment of the present disclosure, the optical adhesive layer 5 illustrated in FIG. 11 can be formed by doping the haze particles in the bonding layer 5a at any position between the flexible display panel 1 and the flexible protective layer 2.

Exemplarily, three bonding layers 5a are formed between the flexible display panel 1 and the flexible protective layer 2. If all of the three adhesive layers 5a are mixed with the haze particles, each of the three adhesive layers 5a can form the optical bonding layer 5. If one or two of the three adhesive layers 5a are mixed with the haze particles, the bonding layer(s) 5a can be formed by the one or two adhesive layers 5a mixed with the haze particles.

Alternatively, the diffusion layer may also be a resin material layer such as a PMMA (polymethyl methacrylate) layer or a PC (polycarbonate) layer, and the resin material layer is mixed with a light diffusing agent.

In some embodiments of the present disclosure, the light diffusing agent mainly comprises an inorganic light diffusing agent and an organic light diffusing. The inorganic light diffusing agent comprises: nano barium sulfate, calcium carbonate, silicon dioxide and the like. The organic light diffusing agent comprises: acrylic, styrene, acrylic resin, and the like. These resins themselves are transparent or translucent, and most of the light can pass through the resins. By adopting the difference between a refractive index of materials of these light diffusing agents and a refractive index of the resin material layer, a travelling direction of the light can be changed, and the light is scattered in different directions. That is, the light emitted from the flexible display panel 1 can be scattered by the resin material layer which is mixed with the light diffusing agent. Thus, when the light emitted from the flexible display panel 1 enters the human eye after passing through the dent in the flexible protective layer 2, an hazing visual effect is presented, so that the unevenness is less visible to the human eye, thereby enabling the appearance of the display screen to be more flat, and improving the using performance of the folding screen product.

Figure 12:
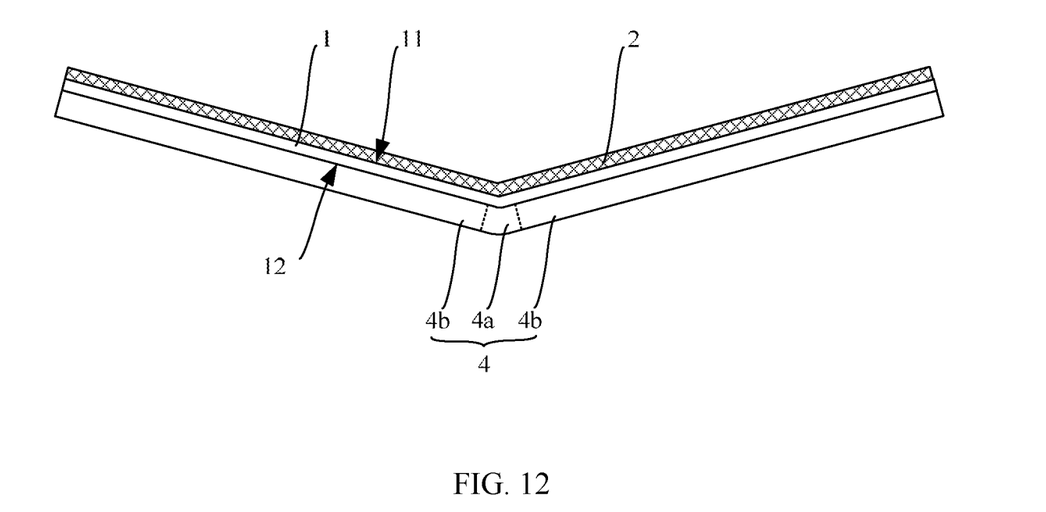
FIG. 12 is a schematic structure diagram of a cross section of a display screen according to some embodiments.

Optionally, FIG. 12 is a schematic structure diagram of a cross section of a display screen according to some embodiments. As illustrated in FIG. 12, compared with the structure of the display panel illustrated in FIG. 2, the display screen may further comprise a substrate 4 located on a back surface of the flexible display panel 1. The light-emitting surface 11 and the back surface 12 are two opposite side surfaces of the flexible display panel 1. The substrate 4 comprises a foldable region 41a and a non-foldable region 41b connected to the foldable region 41a. The foldable region 41a is a region on the substrate 4 that faces a region required to be folded on the flexible display panel 1. The non-foldable region 41b is another region on the substrate 4 other than the foldable region 41a.

Exemplarily, the foldable region 41a is made of a flexible material, and the non-foldable region 41b is made of a rigid material. The foldable region 41a may adopt PET (Polyethylene terephthalate) as a substrate which is relatively soft, so that it is easy to complete folding deformation by arranging this flexible material in the foldable region 41a to cooperate with the display screen. The non-foldable region 41b may adopt a metal material having higher rigidity as a substrate. For example, the rigid material may be a steel plate, such as a SUS steel plate, wherein SUS is a steel grade, S stands for Steel, U strands for Use, and S stands for Stainless. Using the steel plate as the substrate in the non-foldable region 41b can improve the hardness of the display screen and the use is convenient.

Alternatively, in other embodiments, the substrate 4 is a flexible substrate. That is, the whole substrate 4 is made of a flexible material. Referring to FIG. 12, both the foldable region 41a and the non-foldable region 41b of the substrate 4 are made of the flexible material. For example, the whole substrate 4 may be made of PET. The substrate made of PET is relatively soft, so that it is easy to complete the folding deformation by, cooperating with the display screen, thereby avoiding the use of steel and saving the production cost.

In some embodiments of the present disclosure, the display screen may further comprise at least one of a polarizer, a touch panel (TP), a back plate film (BPF) and a buffer layer.

The polarizer is located on the light-emitting surface. After the external environment light passes through the polarizer, the light can be converted into linearly polarized light and deflected by a certain angle, so that after the light is irradiated onto the metal electrode on the flexible display panel and reflected, the reflected light is prevented from passing through the polarizer again through a polarization detection function of the polarizer, thereby preventing the human eye from seeing the metal electrode on the flexible display panel and improving the aesthetic appearance of the flexible display panel. The touch panel is located on the light-emitting surface, so that touch control is convenient. The back plate film is located on the back surface of the flexible display panel. The back plate film is configured to provide mounting support for the flexible display panel so as to facilitate the mounting of the flexible display panel. The buffer layer is located on the back surface of the flexible display panel, Arranging the buffer layer on the back surface of the flexible display panel can provide a buffering force for the flexible display panel to prevent the flexible display panel from being damaged easily.

The light-emitting surface and the back surface are two opposite side surfaces of the flexible display panel.

Figure 13:
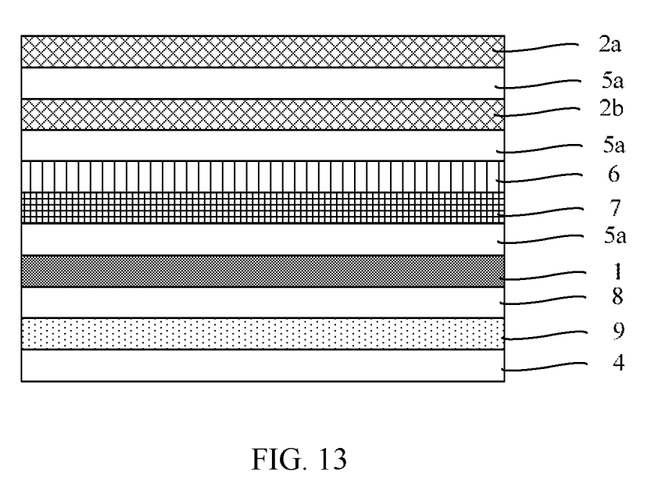
FIG. 13 is a schematic structure diagram of a cross section of a display screen according to some embodiments.

Exemplarily, FIG. 13 is a schematic structure diagram of a cross section of a display screen according to yet another exemplary embodiment. As illustrated in FIG. 13, the display screen comprises: a first protective film layer 2a, a second protective film layer 2b, a polarizer 6, a touch panel 7, a flexible display panel 1, a back plate film 8, a buffer layer 9, and a substrate 4 sequentially stacked. An optical adhesive layer is disposed between the first protective film layer 2a and the second protective film layer 2b between the second protective film layer 2b and the polarizer 6, and between the touch panel 7 and the flexible display panel 1, respectively.

The structures of the first protective film layer and the second protective film layer may refer to the embodiment illustrated in FIG. 11. The structure of the substrate may refer to the embodiment illustrated in FIG. 12. Detailed descriptions are omitted herein.

In various embodiments of the present disclosure, the light-emitting surface of the flexible display panel is covered with the flexible protective layer for protecting the flexible display panel, and the anti-reflection structure is disposed on the light-emitting side surface of the flexible protective layer. With the anti-reflection structure, the possibility of specular reflection of external environment light on the light-emitting side surface of the flexible protective layer is reduced, so that even if a crease and an uneven portion visible to a naked eye caused by repeated bending appear on a protective film of the display screen, intensity of light reflected from the crease and the uneven portion on the flexible protective layer to a human eye can be weakened under the action of the anti-reflection structure. Thus, the crease and the uneven portion are less visible to the human eye. Therefore, the unevenness feeling of the display screen caused by the specular reflection is reduced, enabling the appearance of the display screen to be flatter, and improving using performance of a folding screen product.

Various embodiments of the present disclosure also provide a terminal comprising the display screen as illustrated in any one of FIGS. 2 to 13.

Exemplarily, the terminal may be a mobile phone, a digital broadcast terminal, a game console, a tablet computer, a personal digital assistant, a wearable device, or the like.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

The above description includes part of embodiments of the present disclosure, and not limits the present disclosure. Any modifications, equivalent substitutions, improvements, etc., within the spirit and principles of the present disclosure, are included in the scope of protection of the present disclosure.

It is apparent that those of ordinary skill in the art can make various modifications and variations to the embodiments of the disclosure without departing from the spirit and scope of the disclosure. Thus, it is intended that the present disclosure cover the modifications and the modifications.

Various embodiments in this specification have been described in a progressive manner, where descriptions of some embodiments focus on the differences from other embodiments, and same or similar parts among the different embodiments are sometimes described together in only one embodiment.

It should also be noted that in the present disclosure, relational terms such as first and second, etc., are only used to distinguish one entity or operation from another entity or operation, and do not necessarily require or imply these entities having such an order or sequence. It does not necessarily require or imply that any such actual relationship or order exists between these entities or operations.

Moreover, the terms "include," "including," or any other variations thereof are intended to cover a non-exclusive inclusion within a process, method, article, or apparatus that comprises a list of elements including not only those elements but also those that are not explicitly listed, or other elements that are inherent to such processes, methods, goods, or equipment.

In the case of no more limitation, the element defined by the sentence "includes a . . . " does not exclude the existence of another identical element in the process, the method, or the device including the element.

Specific examples are used herein to describe the principles and implementations of some embodiments. The description is only used to help convey understanding of the possible methods and concepts. Meanwhile, those of ordinary skill in the art can change the specific manners of implementation and application thereof without departing from the spirit of the disclosure. The contents of this specification therefore should not be construed as limiting the disclosure.

For example, in the description of the present disclosure, the terms "some embodiments," or "example," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

In the descriptions, with respect to circuit(s), unit(s), device(s), component(s), etc., in some occurrences singular forms are used, and in some other occurrences plural forms are used in the descriptions of various embodiments. It should be noted; however, the single or plural forms are not limiting but rather are for illustrative purposes. Unless it is expressly stated that a single unit, device, or component etc. is employed, or it is expressly stated that a plurality of units, devices or components, etc. are employed, the circuit(s), unit(s), device(s), component(s), etc. can be singular, or plural.

Based on various embodiments of the present disclosure, the disclosed apparatuses, devices, and methods can be implemented in other manners. For example, the abovementioned devices can employ various methods of use or implementation as disclosed herein.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

Dividing the device into different "regions," "units," "components" or "layers," etc. merely reflect various logical functions according to some embodiments, and actual implementations can have other divisions of "regions," "units," "components" or "layers," etc. realizing similar functions as described above, or without divisions. For example, multiple regions, units, or layers, etc. can be combined or can be integrated into another system. In addition, some features can be omitted, and some steps in the methods can be skipped.

Those of ordinary skill in the art will appreciate that the units, components, regions, or layers, etc. in the devices provided by various embodiments described above can be provided in the one or more devices described above. They can also be located in one or multiple devices that is (are) different from the example embodiments described above or illustrated in the accompanying drawings. For example, the units, regions, or layers, etc. in various embodiments described above can be integrated into one module or divided into several sub-modules.

The various device components, modules, units, blocks, or portions may have modular configurations, or are composed of discrete components, but nonetheless can be referred to as "modules" in general. In other words, the "components," "modules," "blocks," "portions," or "units" referred to herein may or may not be in modular forms.

Moreover, the terms "first" and "second" are used for descriptive purposes only and are not to be construed as indicating or implying a relative importance or implicitly, indicating the number of technical features indicated. Thus, elements referred to as "first" and "second" may include one or more of the features either explicitly or implicitly. In the description of the present disclosure, "a plurality" indicates two or more unless specifically defined otherwise.

The order of the various embodiments described above are only for the purpose of illustration, and do not represent preference of embodiments.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to the disclosed aspects of the exemplary embodiments can be made in addition to those described above by a person of ordinary skill in the art having the benefit of the present disclosure without departing from the spirit and scope of the disclosure contemplated by this disclosure and as defined in the following claims. As such, the scope of this disclosure is to be accorded the broadest reasonable interpretation so as to encompass such modifications and equivalent structures.

Other embodiments of the present disclosure will be apparent to those skilled in the art from consideration of the specification and practice of the present disclosure. This application is intended to cover any variations, uses, or adaptations of the present disclosure following the general principles thereof and comprising common knowledge or commonly used technical measures which are not disclosed herein. The specification and embodiments are to be considered as exemplary only, with a true scope and spirit of the present disclosure is indicated by the following claims.

The invention claimed is:

1. A display screen, comprising:
    a flexible display panel, and
    a flexible protective layer covering a light-emitting surface of the flexible display panel,
    wherein a side surface of the flexible protective layer facing away from the flexible display panel is a light-emitting side surface, and an anti-reflection structure is disposed on the light-emitting side surface;
    wherein the display screen further comprises a substrate located on a back surface of the flexible display panel, and the light-emitting surface and the back surface are two opposite side surfaces of the flexible display panel;
    the substrate comprises a foldable region and a non-foldable region connected to the foldable region, the foldable region is made of a flexible material, and the non-foldable region is made of a rigid material;
    or, the substrate is a flexible substrate.

2. The display screen of claim 1, wherein the anti-reflection structure comprises a plurality of grooves spaced apart on the light-emitting side surface; or
    the anti-reflection structure comprises a plurality of protrusions spaced apart on the light-emitting side surface; or
    the anti-reflection structure comprises a plurality of protrusions and a plurality of grooves alternately spaced apart on the light-emitting side surface.

3. The display screen of claim 2, wherein a cross section of the groove in a direction parallel to the display screen is a closed curved pattern or a polygon; and the groove is cylindrical; or an area of a cross section of the groove in the direction parallel to the display screen is positively correlated with a distance from the cross section to the light-emitting surface.

4. The display screen of claim 2, wherein a cross section of the protrusion in a direction parallel to the display screen is a closed curved pattern or a polygon, and the protrusion is cylindrical; or an area of a cross section of the protrusion in the direction parallel to the display screen is negatively correlated with a distance from the cross section to the light-emitting surface.

5. The display screen of claim 2, wherein the anti-reflection structure and the flexible protective layer are formed into an integral structure.

6. The display screen of claim 5, further comprising a transparent layer covering the anti-reflection structure.

7. The display screen of claim 2, further comprising a scattering layer covering the light-emitting side surface, wherein the anti-reflection structure and the scattering layer are formed into an integral structure.

8. The display screen of claim 1, further comprising a diffusion layer covering the light-emitting surface, wherein the diffusion layer is disposed between the flexible display panel and the flexible protective layers.

9. The display screen of claim 8, wherein the diffusion layer is an optical adhesive layer in which haze particles are provided;
    or, the diffusion layer is a resin material layer in which a light diffusing agent is mixed.

10. The display screen of claim 1, wherein the flexible protective layer at least comprises a first protective film layer and a second protective film layer stacked together, and the second protective film layer is located between the first protective film layer and the flexible display panel.

11. The display screen of claim 10, wherein the first protective film layer is a polyimide thin film, and the second protective film layer is a polyimide thin film or an ultra-thin float glass film layer.

12. The display screen of claim 1, wherein the rigid material is a steel sheet.

13. The display screen of claim 1, further comprising at least one of a polarizer, a touch panel, a back plate film and a buffer layer, wherein
    the polarizer is located on the light-emitting surface, the touch panel are located on the light-emitting surface, the back plate film is located on the back surface of the flexible display panel, the buffer layer are located on the back surface of the flexible display panel, and the light-emitting surface and the back surface are two opposite side surfaces of the flexible display panel.

14. A terminal, comprising the display screen of claim 1.

15. The terminal of claim 14, wherein the anti-reflection structure is configured to reduce specular reflection of external environment light on the light-emitting side surface of the flexible protective layer, such that bending marks and uneven portions of the flexible protective layer resulting from repeated bending are less visible to the user eyes.

16. The terminal of claim 15, wherein the terminal is a foldable mobile phone.

17. The terminal of claim 16, wherein the display screen comprises an organic light-emitting diode (OLED) display screen.

18. The terminal of claim 17, wherein display screen further comprises a scattering layer as a carrier of the anti-reflection structure to thereby avoid directly processing the anti-reflection structure on the flexible protective layer and improving flatness of the display screen and processing efficiency.

* * * * *